(12) United States Patent
Tanaka

(10) Patent No.: US 7,032,147 B2
(45) Date of Patent: Apr. 18, 2006

(54) BOUNDARY SCAN CIRCUIT

(75) Inventor: Hitoshi Tanaka, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 529 days.

(21) Appl. No.: 10/405,489

(22) Filed: Apr. 3, 2003

(65) Prior Publication Data

US 2004/0010740 A1 Jan. 15, 2004

(30) Foreign Application Priority Data

Jul. 12, 2002 (JP) .............................. 2002-203729

(51) Int. Cl.
*G01R 31/28* (2006.01)

(52) U.S. Cl. ...................................... 714/727; 714/724

(58) Field of Classification Search ................ 714/724, 714/726, 727, 733, 734
See application file for complete search history.

(56) References Cited

U.S. PATENT DOCUMENTS 6,073,254 A * 6/2000 Whetsel ........................ 714/30
6,804,725 B1 * 10/2004 Whetsel .......................... 710/5
2001/0037480 A1 * 11/2001 Whetsel ....................... 714/727

FOREIGN PATENT DOCUMENTS

JP          05-093762          4/1993

* cited by examiner

*Primary Examiner*—Phung My Chung
(74) *Attorney, Agent, or Firm*—Volentine Francos & Whitt, PLLC

(57) ABSTRACT

An electronic device includes a first circuit, a second circuit, and a boundary scan circuit. The boundary scan circuit includes a boundary scan register having a first cell connected to an input node of the first circuit, and a second cell connected between an output node of the first circuit and an input node of the second circuit. The second cell has a latch flip-flop. The boundary scan circuit also includes an interface that enables and disables the latching operation of the latch flip-flop according to an input instruction code. While the latching operation is disabled, the output from the latch flip-flop to the second circuit remains unchanged. In this state, the boundary scan circuit can be used to test the first circuit without unintended effects on the second circuit.

20 Claims, 13 Drawing Sheets

NEGATIVE-EDGE-TRIGGERED
FLIP-FLOP

BOUNDARY SCAN CIRCUIT

BACKGROUND OF THE INVENTION

1. Field of the Invention

The present invention relates to a JTAG device having an IP (intellectual property) core.

2. Description of the Related Art

A JTAG device is an integrated circuit conforming to a standard developed by the Joint Test Action Group (JTAG) to simplify the testing of integrated circuits and printed circuit boards. This standard, which has been adopted as standard 1149.1 (Standard Test Access Port and Boundary-Scan Architecture) of the Institute of Electrical and Electronics Engineers (IEEE), defines a boundary scan technique that is widely used in the semiconductor industry.

As an example of a conventional JTAG device, FIG. 10 schematically shows an integrated circuit including a flash controller 101 as an IP core, a flash memory 102, and a boundary scan circuit for testing the flash controller 101. The boundary scan circuit includes a boundary scan register (BSR), a test access port (TAP), and a TAP interface (TAP IF). The boundary scan register includes a pair of input boundary scan cells (BSC1, BSC2) and a pair of output boundary scan cells (BSC3, BSC4). The test access port includes a Test Data In (TDI) terminal, a Test Clock (TCK) terminal, a Test Mode Select (TMS) terminal, and a Test Data Out (TDO) terminal.

The TDI, TCK, and TMS terminals are coupled to input terminals of the TAP interface. The TDI terminal is also coupled to a serial data input terminal (SI) of input boundary scan cell BSC1. The TDO terminal is coupled to a serial data output (SO) terminal of output boundary scan cell BSC4 and an output terminal of the TAP interface. Data output (DO) terminals of the input boundary scan cells BSC1 and BSC2 are coupled to input terminals of the flash controller 101. Output terminals of the flash controller 101 are coupled to data input (DI) terminals of the output boundary scan cells BSC3 and BSC4. The DO terminals of the output boundary scan cells BSC3 and BSC4 are coupled to input terminals of the flash memory 102. The SO terminal of input boundary scan cell BSC1 is coupled to the SI terminal of input boundary scan cell BSC2. The SO terminal of input boundary scan cell BSC2 is coupled to the SI terminal of output boundary scan cell BSC3. The SO terminal of output boundary scan cell BSC3 is coupled to the SI terminal of output boundary scan cell BSC4.

FIG. 11 is a circuit diagram of a conventional output boundary scan cell. The output boundary scan cell includes an input multiplexer MUX1, an output multiplexer MUX2, a shift flip-flop FF1, and a latch flip-flop FF2. The output boundary scan cell further includes the DI, DO, SI, and SO terminals mentioned above, and terminals for input of a shift select signal (Shift-DR), a data shift clock signal (Clock-DR), a data latch clock signal (Update-DR), and a mode select signal (Mode).

The DI terminal is coupled to input terminal A of multiplexers MUX1 and MUX2. The SI terminal is coupled to input terminal B of the input multiplexer MUX1. The output terminal Y of the input multiplexer MUX 1 is coupled to the data input terminal D of the shift flip-flop FF1. The data output terminal Q of the shift flip-flop FF1 is coupled to the SO terminal and the data input terminal D of the latch flip-flop FF2. The data output terminal Q of the latch flip-flop FF2 is coupled to data input terminal B of the output multiplexer MUX2. The data output terminal Y of the output multiplexer MUX2 is coupled to the DO terminal. The Shift-DR signal is supplied to the selection input terminal S of the input multiplexer MUX1. The Clock-DR signal is supplied to the clock input terminal (CK) of the shift flip-flop FF1. The Update-DR signal is supplied to the CK terminal of the latch flip-flop FF2. The Mode signal is supplied to the S terminal of the output multiplexer MUX2.

FIG. 12 is a block diagram showing the configuration of a conventional TAP interface (TAP IF). The TAP interface includes a TAP controller (TAPC), an instruction register (IR), an instruction decoder (ID), a multiplexer (MUX), and an output buffer (BUF). The configuration of the TAP controller and its control method conform to the above-mentioned IEEE standard 1149.1.

The conventional procedure for testing the flash controller 101 will be briefly described below.

The TAP controller is a state machine with a CAPTURE-DR state, a SHIFT-DR state, an UPDATE-DR state, a SHIFT-IR state, an UPDATE-IR state, and various other states. State transitions are controlled by the TCK and TMS signals during the test procedure. Test instruction codes (INTEST etc.) input from the TDI terminal are shifted into the instruction register IR in the SHIFT-IR state, and passed to the instruction decoder ID in the UPDATE-IR state.

In the SHIFT-DR state, the Shift-DR signal selects the SI input terminals of the boundary scan cells, and test data input from the TDI terminal are shifted into the shift flip-flops FF1 of the input boundary scan cells BSCI in response to the Clock-DR signal. In the UPDATE-DR state, the test data are transferred from the shift flip-flops FF1 to the latch flip-flops FF2 and output to the flash controller 101 through the output multiplexers MUX2 and DO terminals of the input boundary scan cells BSCI, in response to the Update-DR and Mode signals. An internal test of the flash controller 101 then begins.

The output data of the flash controller 101 resulting from the test are captured by the shift flip-flops FF1 of the output boundary scan cells in the CAPTURE-DR state, in which the Shift-DR signal selects input terminal A of the input multiplexers MUX1. The captured output data are then shifted through the shift flip-flops FF1 and output serially from the TDO terminal in the SHIFT-DR state, the Shift-DR signal once more selecting input terminal B of the input multiplexers MUX1.

A problem that arises during this test procedure is that each time test data are output from the input boundary scan cells BSCI to the flash controller 101, data are also output from the output boundary scan cells BSCO to the flash memory 102. This is inconvenient, because the data output to the flash memory 102 can have undesired consequences, such causing an unintended write or erase operation in the flash memory 102. These consequences can be avoided by supplying predetermined data for the output boundary scan cells BSCO before supplying test data for the input boundary scan cells BSCI to the TDI terminal, but that lengthens the test time.

Furthermore, the unwanted output of data from the output boundary scan cells BSCO to the flash memory 102 makes it difficult to test the flash controller 101 and the flash memory 102 together. The flash controller 101 and the flash memory 102 must accordingly be tested separately, which takes still more time.

FIG. 13 is a timing diagram of the clock signals in a conventional JTAG device. In the conventional JTAG device, the system clock signal CLK that drives the flash controller 101 and the Clock-DR signal supplied to the CK terminals of the shift flip-flops FF1 of the boundary scan cells BSCI and BSCO are derived from different clock trees.

The timing of the Clock-DR signal must be adjusted with respect to the timing of the system clock signal CLK by an amount $t_A$ that provides an adequate set-up time $t_S$ and hold time $t_H$ with respect to the data input (D) to the shift flip-flop FF1. At high clock speeds, this adjustment is difficult. The IP core must therefore be tested at a comparatively low clock speed, which also increases the test time.

SUMMARY OF THE INVENTION

An object of the present invention is to provide an improved boundary scan circuit that can simplify and speed up the testing of an IP core.

The invented boundary scan circuit is integrated into a JTAG device that also includes a first circuit (the IP core) and a second circuit. The boundary scan circuit includes a boundary scan register having a first cell (an input boundary scan cell) connected to an input node of the first circuit, and a second cell (an output boundary scan cell) connected between an output node of the first circuit and an input node of the second circuit. The second cell has a latch flip-flop.

The boundary scan circuit also includes a TAP interface that controls the boundary scan register. In particular, the TAP interface enables and disables the latching operation of the latch flip-flop in the second cell according to an input instruction code. For example, the TAP interface may enable and disable clock input to the latch flip-flop according to this instruction code.

While the latching operation is disabled, the output from the latch flip-flop to the second circuit remains unchanged. In this state, the first circuit can be tested without affecting the second circuit. Testing of the IP core can accordingly be speeded up.

The invention also provides a method of testing the first circuit, including the following steps:

(a) set control data in the latch flip-flop for output to the second circuit;

(b) disable further latching operations by the latch flip-flop;

(c) supply test input data to the first circuit through the first cell in the boundary scan register;

(d) obtain test output data from the first input circuit through the second cell in the boundary scan register; and (e) repeat steps (c) and (d) while the latching operation by the latch flip-flop remains disabled.

DETAILED DESCRIPTION OF THE INVENTION

Figure 1:
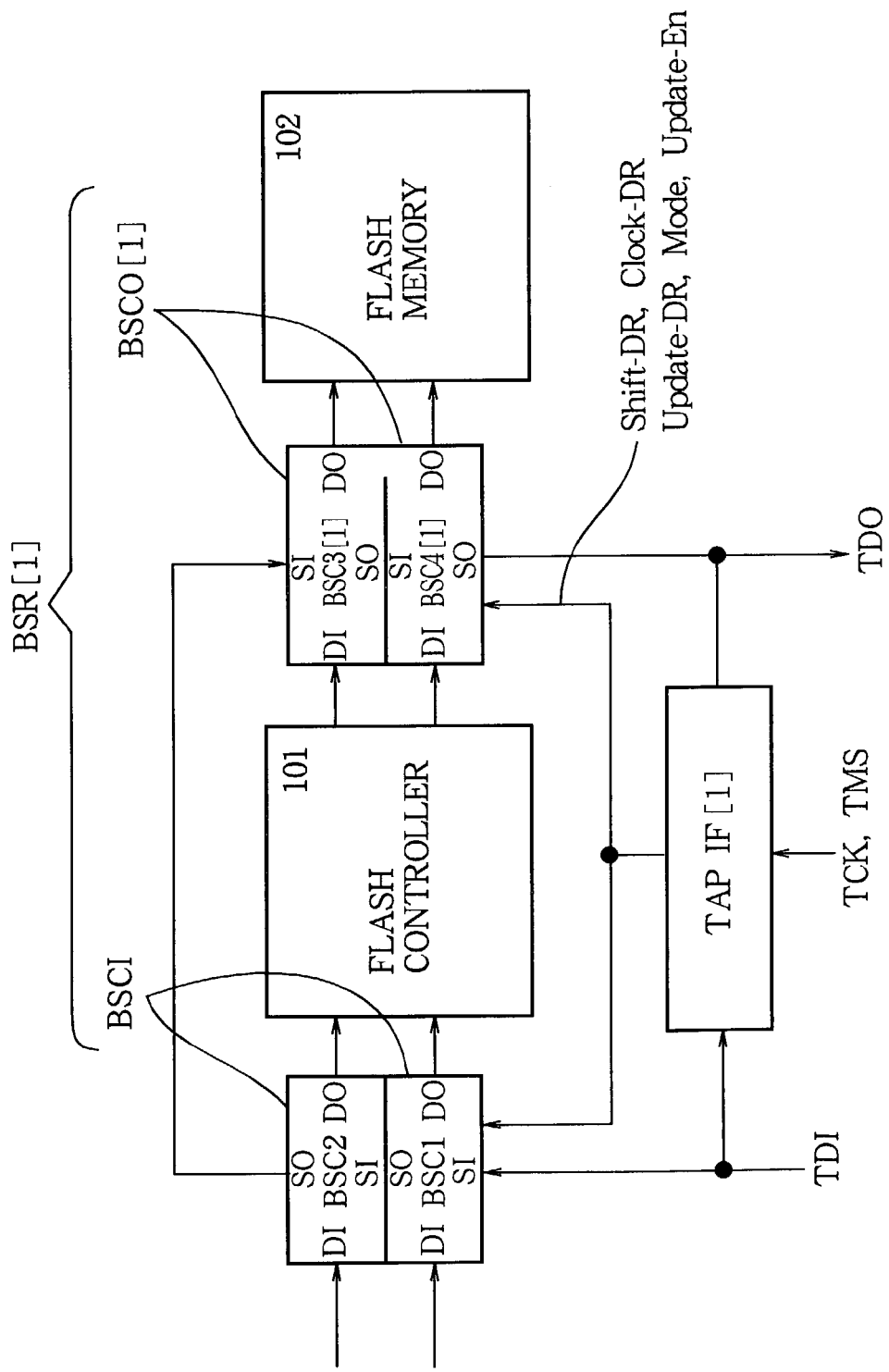
FIG. 1 is a block diagram of a JTAG device illustrating a first embodiment of the invention.

Embodiments of the invention will now be described with reference to the attached drawings, in which like elements are indicated by like reference characters.

First Embodiment

Figure 10:
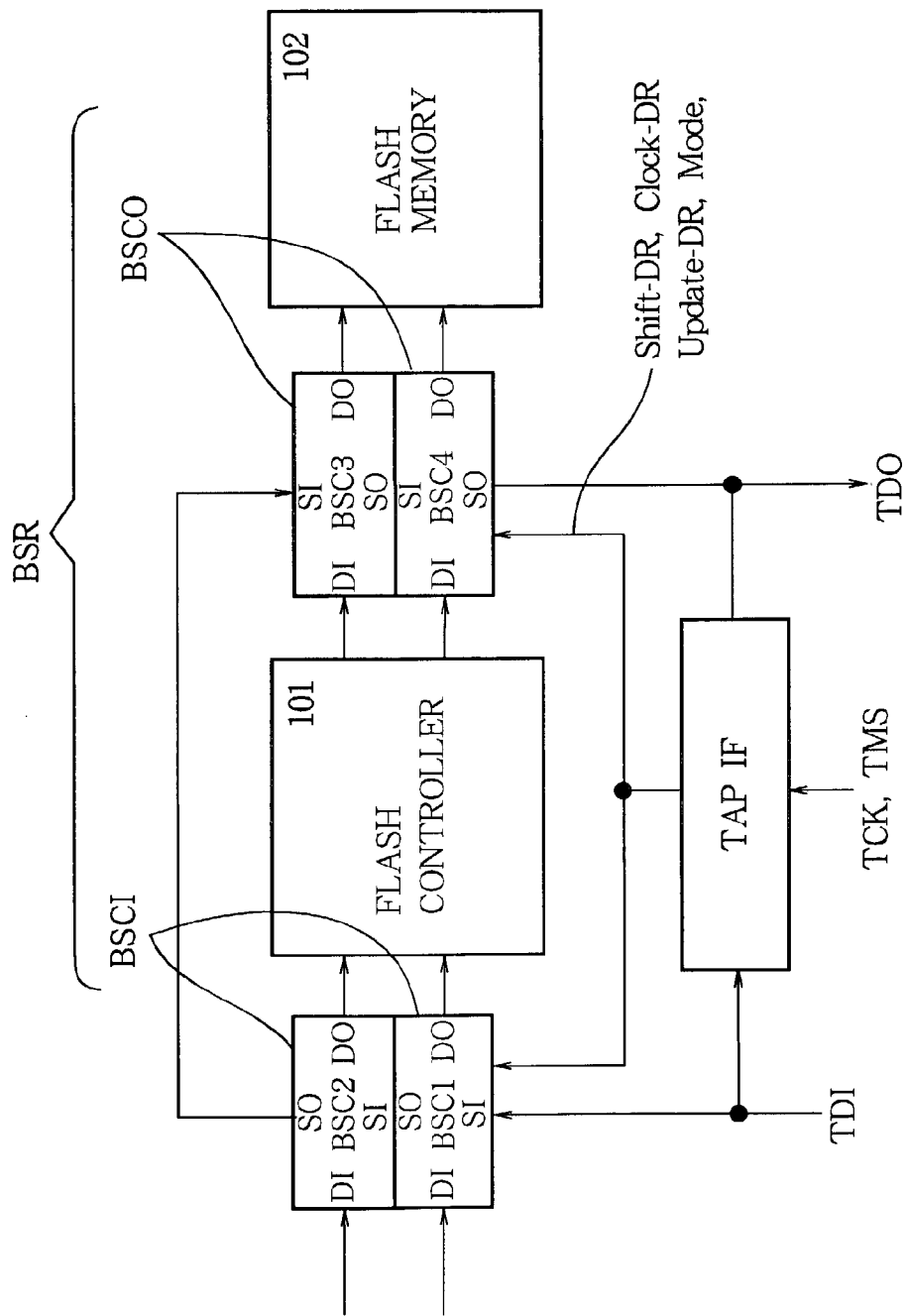
FIG. 10 is a block diagram of a conventional JTAG device.

Referring to FIG. 1, the JTAG device in the first embodiment comprises a flash controller 101 as an IP core, a flash memory 102, and a boundary scan circuit for testing the flash controller 101. The boundary scan circuit has the same general structure as in the conventional JTAG device in FIG. 10, but the internal structure of the output boundary scan cells and the TAP interface differ, as indicated by the bracketed numeral one ([1]) denoting the first embodiment.

The boundary scan circuit in the first embodiment includes a boundary scan register BSR[1], a test access port (TAP) including a Test Data In (TDI) terminal, a Test Clock (TCK) terminal, a Test Mode Select (TMS) terminal, and a Test Data Out (TDO) terminal, and a TAP interface TAP IF[1]. The boundary scan circuit in the first embodiment is obtained from the conventional boundary scan circuit by altering the boundary scan register and the TAP interface.

The boundary scan register BSR[1] in the first embodiment comprises a pair of input boundary scan cells BSCI denoted BSC1 and BSC2 and a pair of output boundary scan cells BSCO[1] denoted BSC3[1] and BSC4[1]. The boundary scan register BSR[1] is obtained from the conventional boundary scan register shown in FIG. 10 by changing the output boundary scan cells BSC3 and BSC4 to output boundary scan cells BSC3[1] and BSC4[1], respectively.

Figure 2:
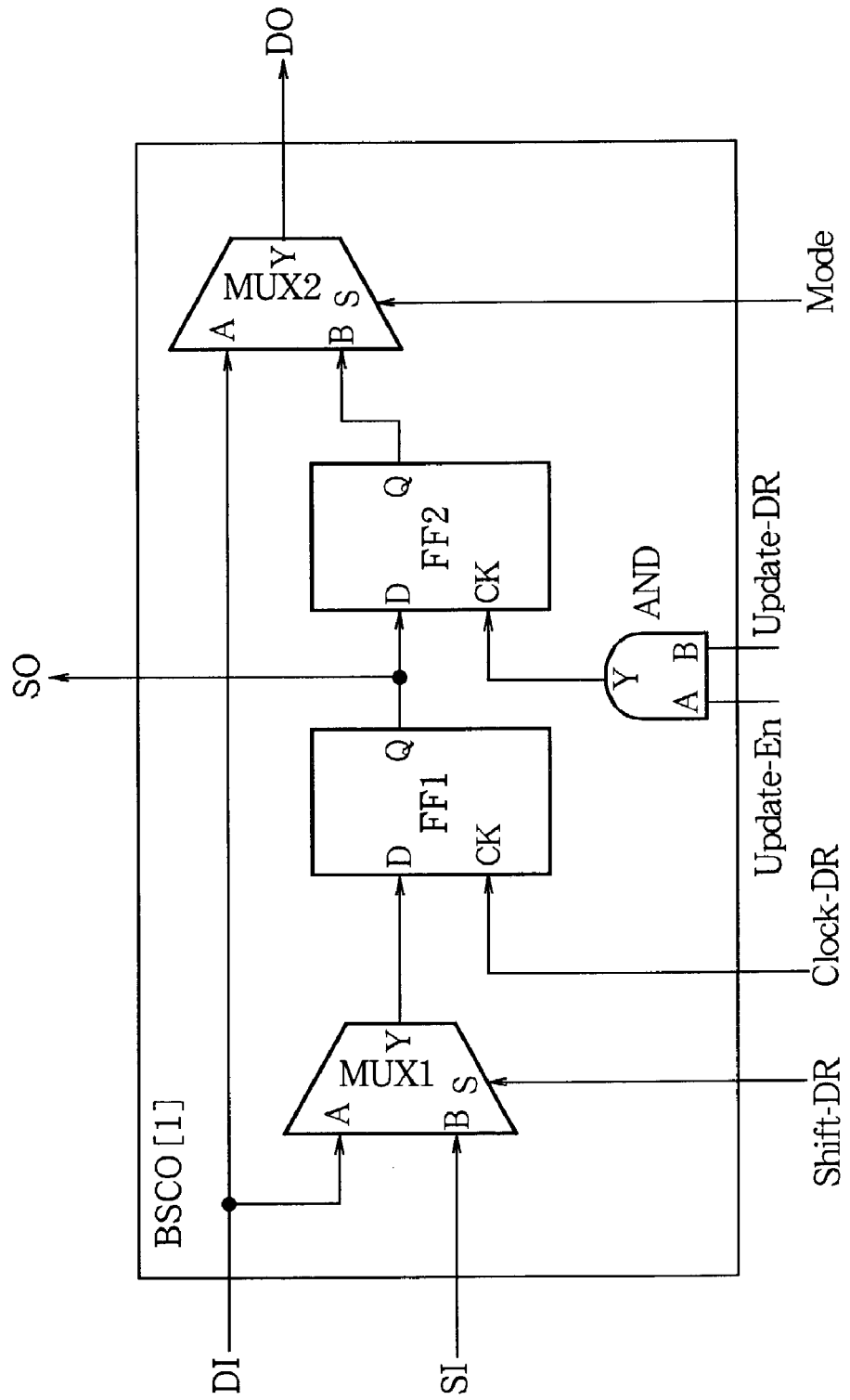
FIG. 2 is a circuit diagram of an output boundary scan cell in the JTAG device in FIG. 1.

FIG. 2 is a circuit diagram of an output boundary scan cell BSCO[1] in the first embodiment. The output boundary scan cell BSCO[1] includes an input multiplexer MUX1, an output multiplexer MUX2, a shift flip-flop FF1, a latch flip-flop FF2, and an AND gate. The output boundary scan cell BISCO[1] in the first embodiment further includes the conventional DI, DO, SI, and SO terminals, and terminals for input of the shift select signal (Shift-DR), the data shift clock signal (Clock-DR), the data latch clock signal (Update-DR), a data latch enable signal (Update-En), and the mode select signal (Mode).

Figure 11:
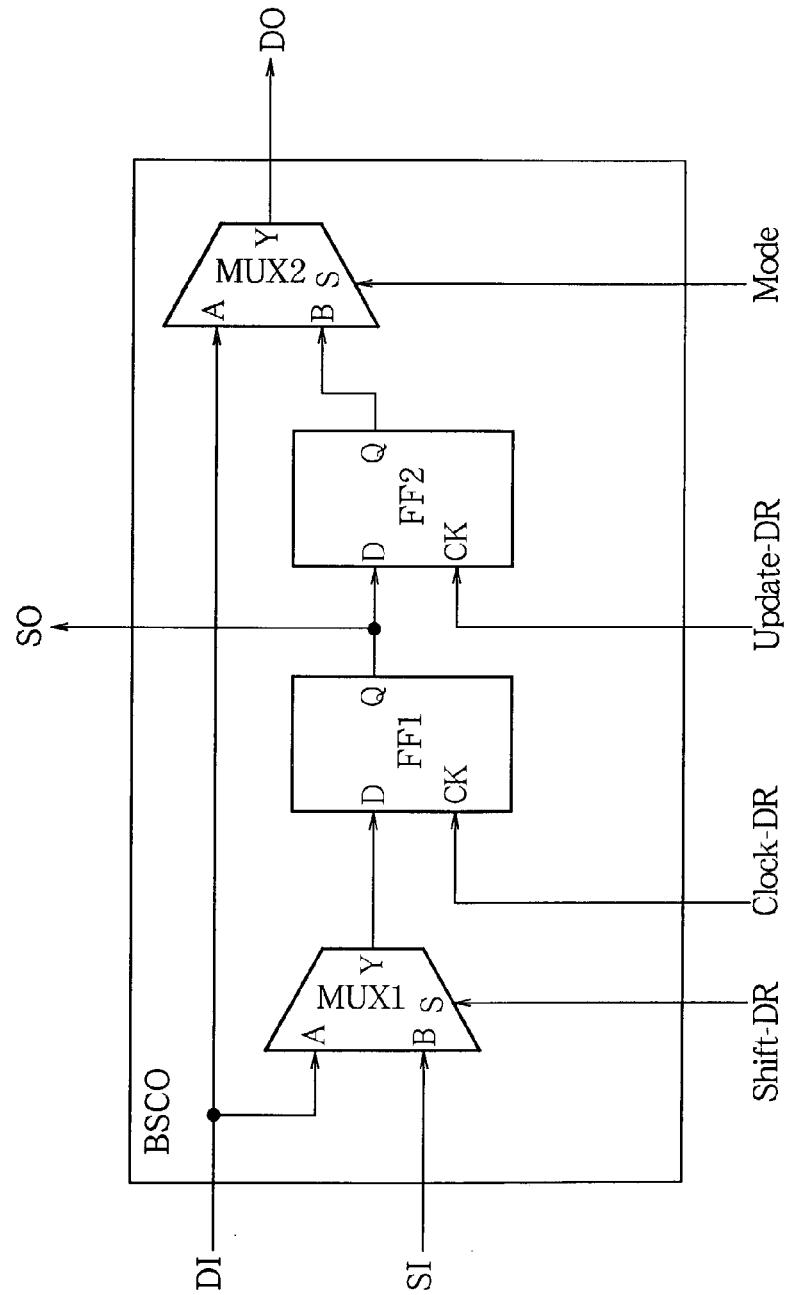
FIG. 11 is a circuit diagram of a conventional output boundary scan cell in the JTAG device in FIG. 10.

The output boundary scan cell BSCO[1] in the first embodiment is thus obtained by adding an AND gate and a terminal for input of the data latch enable signal (Update-En) to the conventional output boundary cell BSCO shown in FIG. 11. The Update-DR and Update-En signals are supplied to the AND gate, and their logical AND is supplied to the CK terminal of the latch flip-flop FF2 as a gated Update-DR signal.

Figure 3:
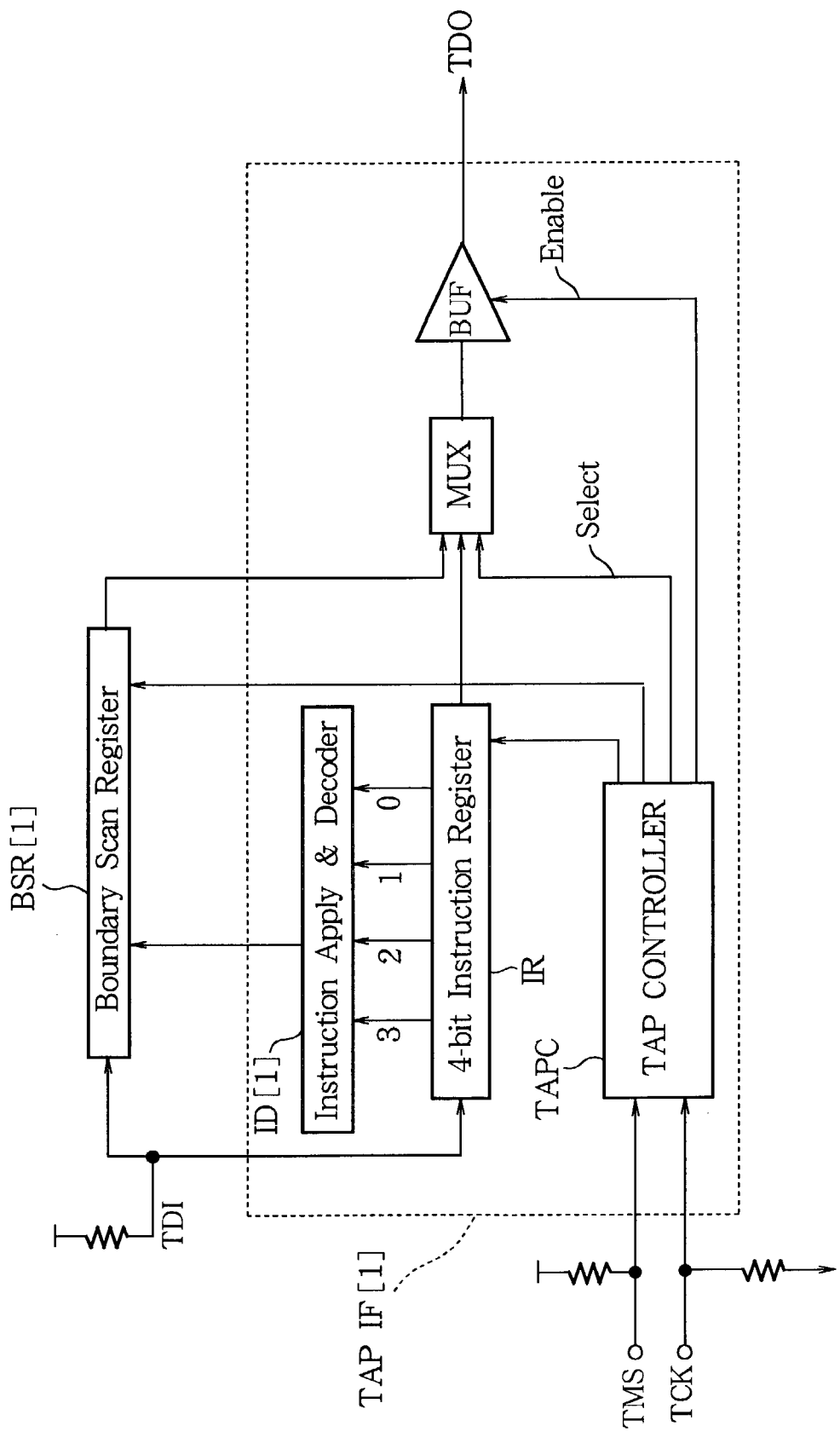
FIG. 3 is a block diagram showing the configuration of a TAP interface in the JTAG device in FIG. 1.
Figure 12:
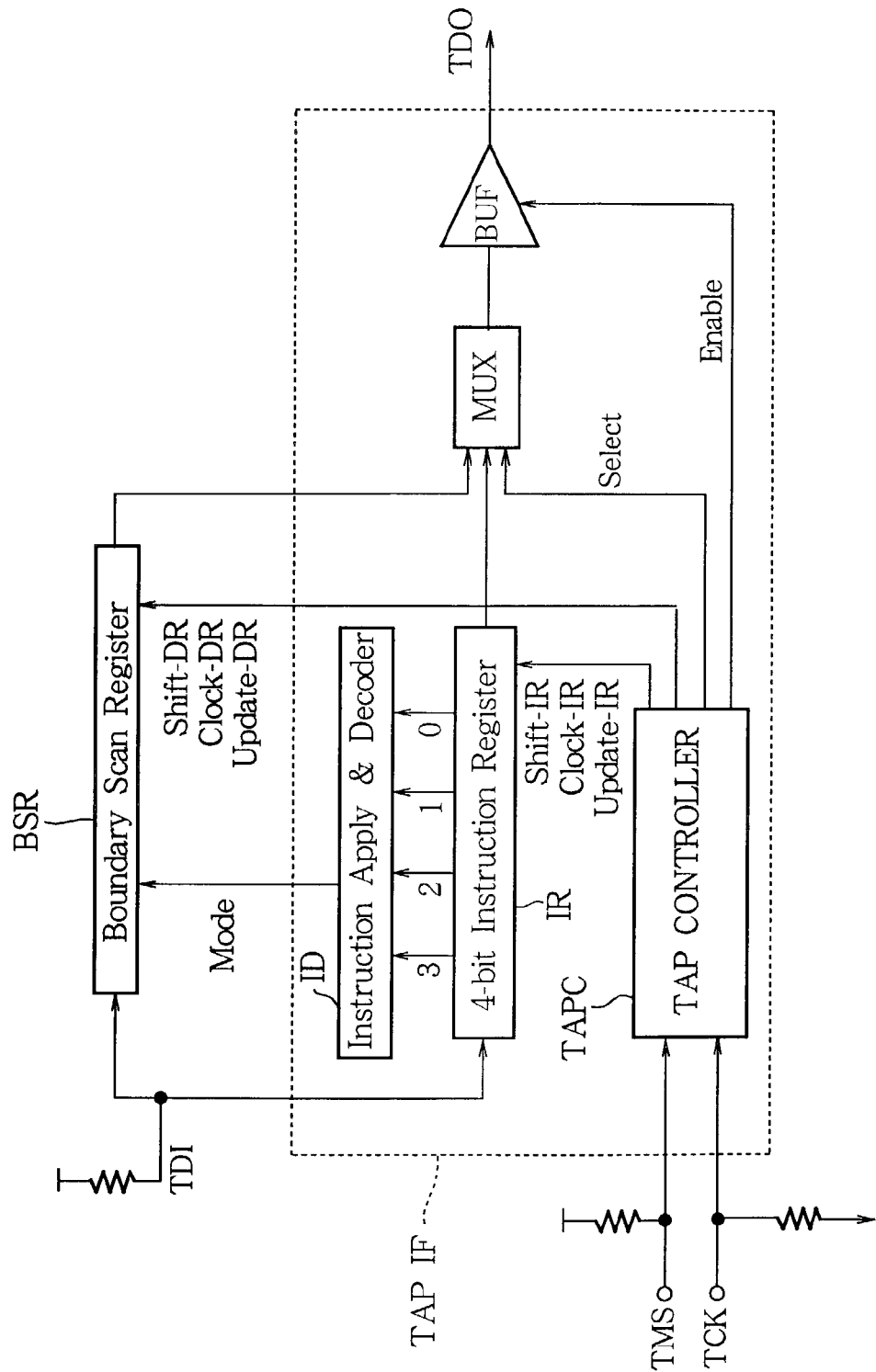
FIG. 12 is a block diagram showing the configuration of a conventional TAP interface in the JTAG device in FIG. 10.
Figure 13:
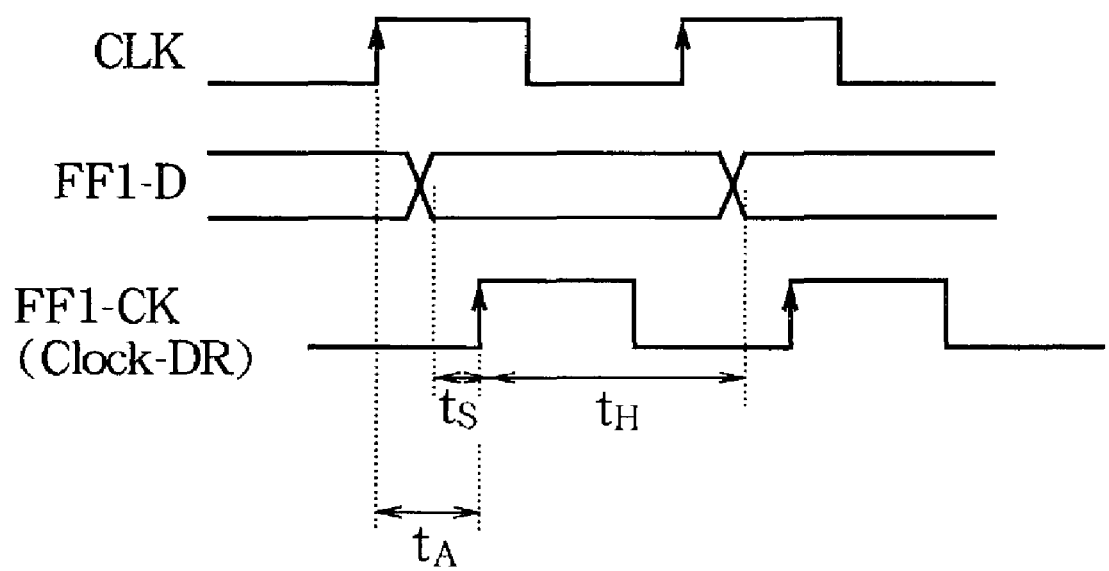
FIG. 13 is a timing diagram illustrating clock signals in the JTAG device in FIG. 10.

FIG. 3 is a block diagram showing the configuration of the TAP interface TAP IF[1]. The TAP interface includes a conventional TAP controller TAPC and instruction register IR, a novel instruction decoder ID[1], and a conventional multiplexer MUX and output buffer BUF. The TAP interface in the first embodiment is obtained from the conventional TAP interface shown in FIG. 12 by changing the instruction decoder ID to instruction decoder ID[1].

The TAP controller samples the test mode select signal (TMS) at the rising edge of the test clock signal (TCK), changes state according to the value of the TMS signal, generates the Shift-DR, Clock-DR, and Update-DR signals according to the new state, and supplies the generated signals to the boundary scan register BSR[1]. The TAP controller also generates Shift-IR, Clock-IR, and Update-IR signals and supplies them to the instruction register IR. The TAP controller furthermore supplies an output select signal (Select) to the multiplexer MUX and an output enable signal (Enable) to the output buffer BUF.

The instruction register is a four-bit register that latches an instruction code supplied from the TDI terminal and outputs the instruction code in parallel form to the instruction decoder ID[1], and in serial form to the multiplexer MUX. The JTAG standard specifies public instruction codes for mandatory and optional instructions, and allows private instruction codes to be used for other (unspecified) purposes.

The instruction decoder ID[1] in the first embodiment decodes the instruction code received from the instruction register IR, and supplies the Update-En and Mode signals to the boundary scan register BSR[1]. The instruction decoder ID[1] in this embodiment is obtained from the conventional instruction decoder shown in FIG. 12 by providing circuitry for generating the Update-En signal according to the instruction code. Incidentally, the instruction decoder ID[1] may also control a bypass register and other optional registers (not shown), and control the outputs of these registers.

The multiplexer MUX selects the serial output of either the boundary scan register BSR[1] or the instruction register IR according to the Select signal. The buffer BUF supplies the output selected by the multiplexer MUX to the TDO terminal when enabled by the Enable signal.

Figure 4:
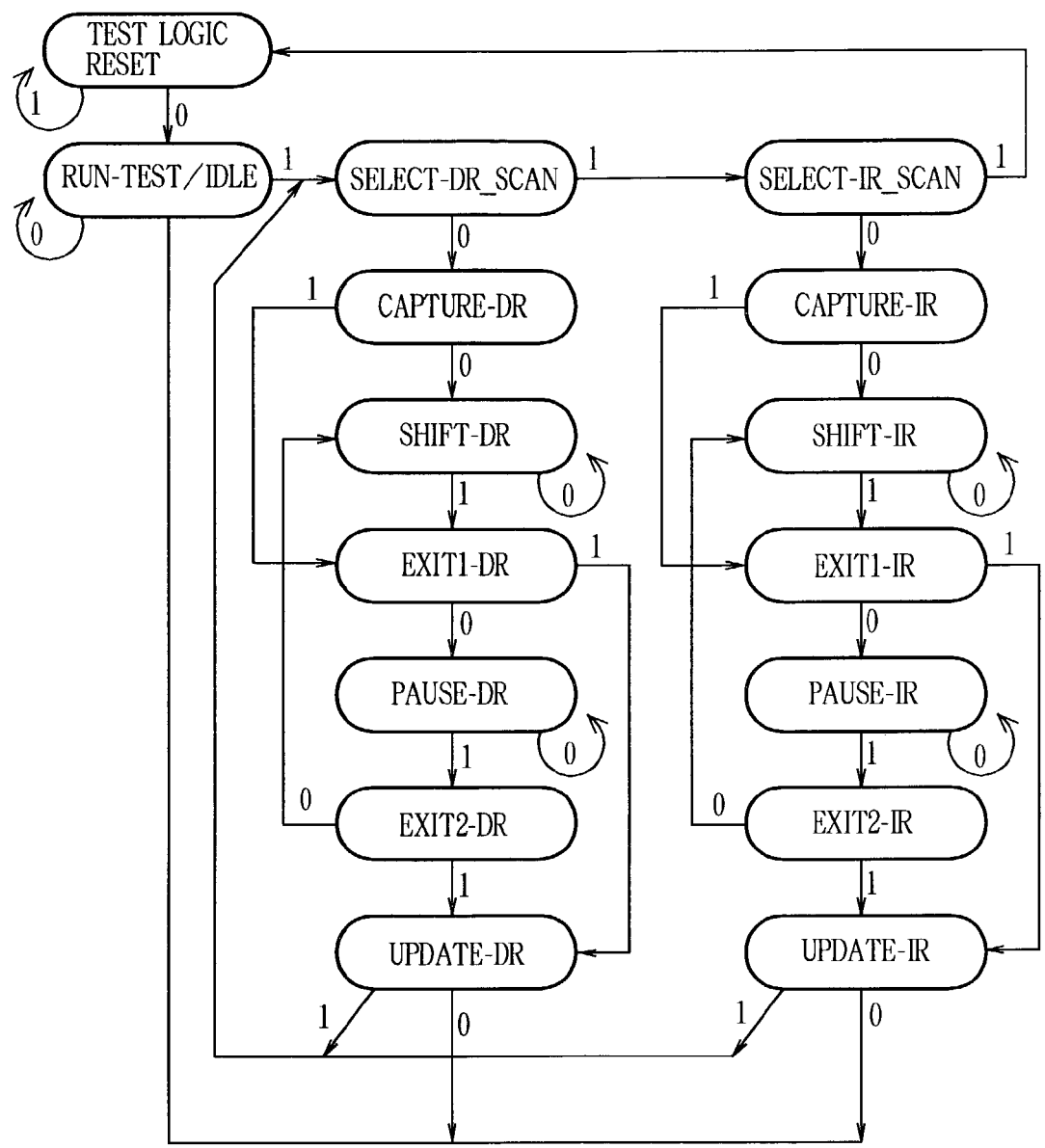
FIG. 4 is a flowchart explaining state transitions of a TAP controller in the first embodiment.

FIG. 4 is a flowchart explaining the state transitions of the TAP controller among its sixteen states: TEST LOGIC RESET, RUN-TEST/IDLE, SELECT-DR-SCAN, CAPTURE-DR, SHIFT-DR, EXIT1-DR, PAUSE-DR, EXIT2-DR, UPDATE-DR, SELECT-IR-SCAN, CAPTURE-IR, SHIFT-IR, EXIT1-IR, PAUSE-IR, EXIT2-IR, and UPDATE-IR.

The state transitions follow two main paths: a data path leading through the SELECT-DR-SCAN, CAPTURE-DR, SHIFT-DR, EXIT1-DR, PAUSE-DR, EXIT2-DR, and UPDATE-DR states, which relate to data registers such as the boundary scan register and optional registers; and an instruction path leading through the SELECT-IR-SCAN, CAPTURE-IR, SHIFT-IR, EXIT1-IR, PAUSE-IR, and EXIT2-IR states, which relate to the instruction register.

The digits '0' and '1' in FIG. 4 denote values of the TMS signal. The TAP controller changes state according to the value of the TMS signal at the rising edge of the TCK signal.

Among the sixteen states of the TAP controller, operations in the two CAPTURE states (CAPTURE-DR and CAPTURE-IR), the two SHIFT states (SHIFT-DR and SHIFT-IR), and the two UPDATE states (UPDATE-DR and UPDATE-IR) are significant; the other states are provided for switching the state flow.

When the TAP controller is in the CAPTURE-DR state, in both the input and the output boundary scan cells of the boundary scan register BSR[1], input terminals A of the input multiplexers MUX1 are selected in response to the Shift-DR signal, so that input data from the DI terminals are captured by the shift flip-flops FF1 in response to the Clock-DR signal. The data input into the DI terminals of the input boundary scan cells BSCI are data to be supplied to the flash controller 101, while the data input into the DI terminals of the output boundary scan cells BSCO[1] are data supplied from the flash controller 101.

In the CAPTURE-IR state, a fixed IR status word is captured by the instruction register in response to the Shift-IR and Clock-IR signals.

When the TAP controller is in the SHIFT-DR state, in both the input and the output boundary scan cells of the boundary scan register BSR[1], input terminals B of the input multiplexers MUX1 are selected in response to the Shift-DR signal, and the data in the shift flip-flops FF1 are shifted out from the SO terminals. Data input into the SI terminal of input boundary scan cell BSC1 from the TDI terminal and data input to the SI terminals of the other input and output boundary scan cells from the SO terminals of the preceding boundary scan cells are shifted into the shift flip-flops FF1. In other words, the data in the shift register comprising the shift flip-flops FF1 of the input and output boundary scan cells BSC1, BSC2, BSC3[1], and BSC4[1] are shifted one bit.

Similarly, in the SHIFT-IR state, the data in the instruction register are shifted one bit.

When the TAP controller is in the UPDATE-DR state, in both the input and the output boundary scan cells of the boundary scan register BSR[1], the data in the shift flip-flops FF1 are captured by the latch flip-flops FF2 in response to the Update-DR signal, and the B input terminals of the output multiplexers MUX2 are selected in response to the Mode signal. The data in the shift flip-flops FF1 are thereby latched in the latch flip-flops FF2 and output to the DO terminals through the output multiplexers MUX2. In the output boundary scan cells BSCO[1], however, the data in the shift flip-flops FF1 are latched by the latch flip-flops FF2 and output to the DO terminals only if the value of the Update-En signal is '1'. If the value of the Update-En signal is '0', then because of the AND gates, the Update-DR signal is not supplied to the CK terminals of the latch flip-flops FF2, the latch flip-flops FF2 do not perform latching operations, and the data in the shift flip-flops FF1 are not output to the DO terminals.

In the UPDATE-IR state, the four-bit data in the instruction register are output to the instruction decoder ID[1] in parallel in response to the Update-IR signal.

Figure 5:
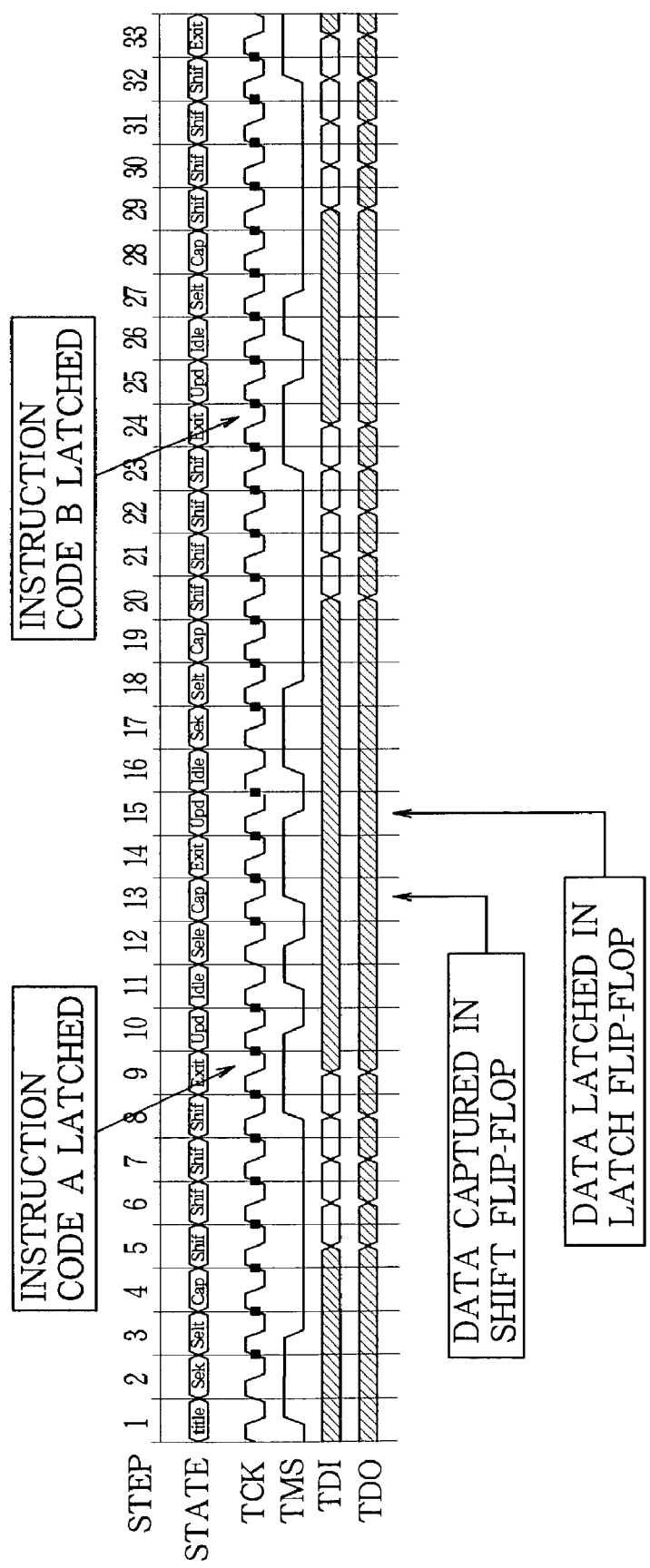
FIG. 5 is a timing diagram explaining operations of the JTAG device in FIG. 1.
Figure 6:
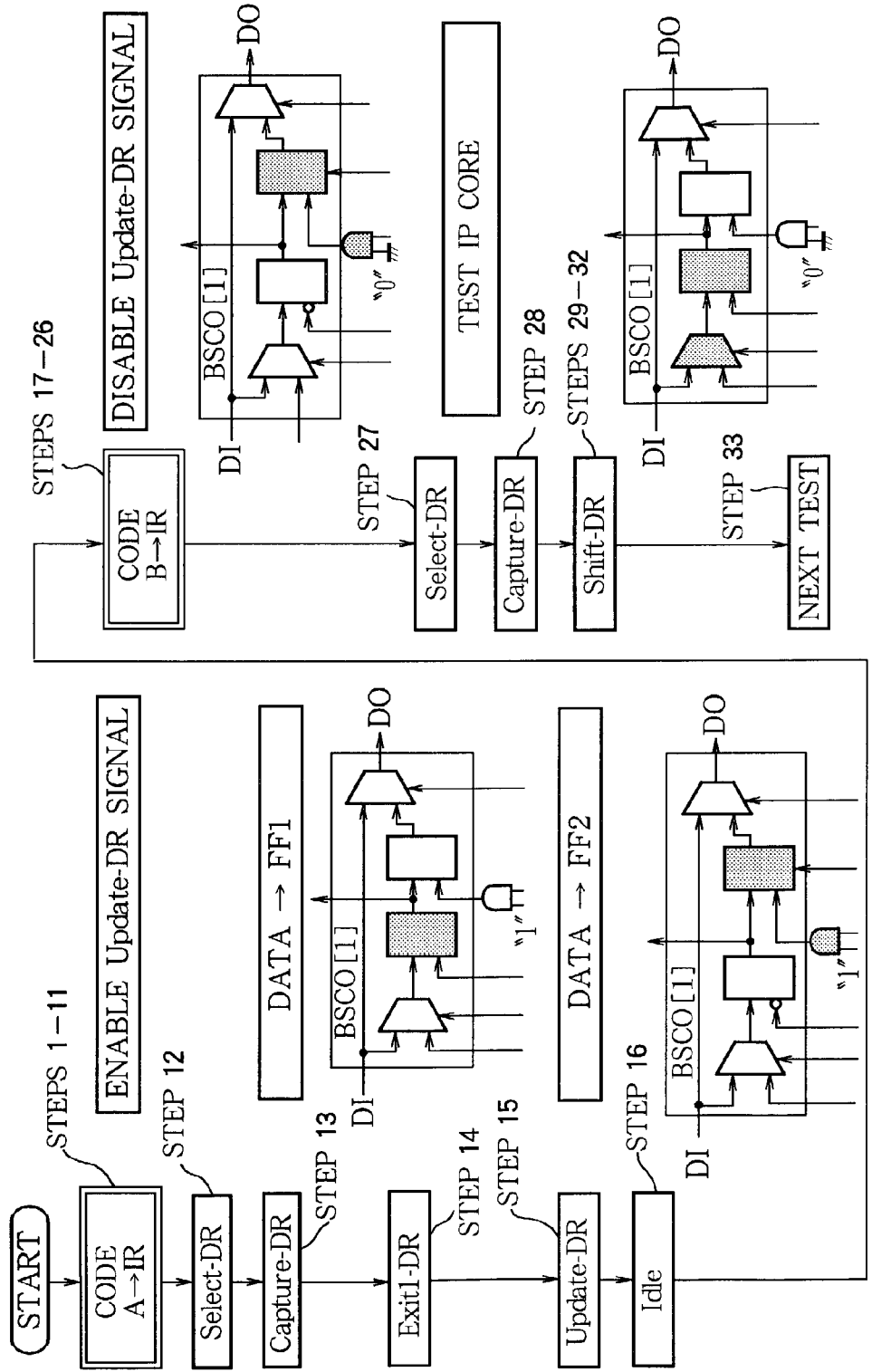
FIG. 6 is a flowchart explaining the operations of the JTAG device in FIG. 1.

FIG. 5 is a timing diagram illustrating test operations in the first embodiment of the present invention. FIG. 6 explains these test operations in flowchart form. The test procedure in the first embodiment will be described with reference to FIGS. 5 and 6.

Steps 1–11

The TAP controller is in the RUN-TEST/IDLE state (denoted Idle in FIG. 5) at step 1, and makes a transition to the SELECT-DR-SCAN (Sele) state at step 2. The TAP controller then makes transitions to the SELECT-IR-SCAN (Sele) state at step 3, the CAPTURE-IR (Cap) state at step 4, the SHIFT-IR (Shif) state at steps 5 to 8, the EXIT1-IR (Exit) state at step 9, and the UPDATE-IR (Upd) state at step 10, and returns to the RUN-TEST/IDLE (Idle) state at step 11.

When the TAP controller is in the SHIFT-IR state during steps 5 to 8, an instruction code A for enabling the Update-DR signal in the output boundary cells BSCO[1] is input to the instruction register from the TDI terminal. Instruction code A may be, for example, a private instruction code. In the UPDATE-IR state at step 10, instruction code A is output from the instruction register to the instruction decoder ID[1]. The value of the Update-En signal supplied to the output boundary cells BSCO[1] thereby becomes '1', enabling the Update-DR signal to pass through the AND gates in the output boundary scan cells BSCO[1] in the boundary scan register BSR[1].

Steps 12–16

The TAP controller transitions to the SELECT-DR-SCAN (Sele) state at step 12, the CAPTURE-DR (Cap) state at step 13, the EXIT1-DR (Exit) state at step 14, and the UPDATE-DR (Upd) state at step 15, and returns to the RUN-TEST/IDLE (Idle) state at step 16.

Before step 13, the flash controller 101 outputs arbitrary data for controlling the flash memory 102, such as data for inactivating the flash memory 102.

When the TAP controller is in the CAPTURE-DR state at step 13, input terminals B of the input multiplexers MUX1 are selected in response to the Shift-DR signal, and the control data supplied from the flash controller 101, such as control data for inactivating the flash memory 102, are captured by the shift flip-flops FF1 of the output boundary scan cells BSCO[1] in response to the Clock-DR signal.

When the TAP controller is in the UPDATE-DR state at step 15, the control data captured by the shift flip-flops FF1 are latched by the latch flip-flops FF2 of the output boundary scan cells BSCO[1] in response to the Update-DR signal. This operation can occur because the value of the Update-En signal is '1'. Input terminals B of the output multiplexers MUX 2 are selected in response to the Mode signal, thereby outputting the control data to the flash memory 102 from the DO terminals.

As an alternative to the above operation, data for controlling the flash memory 102, such as data for inactivating the flash memory 102, may be input from the TDI terminal and captured by the shift flip-flops FF1 in the SHIFT-DR state instead of being captured in the CAPTURE-DR state at step 13.

Steps 17–26

The TAP controller transitions to the SELECT-DR-SCAN (Sele) state at step 17, the SELECT-IR-SCAN (Sele) state at step 18, the CAPTURE-IR (Cap) state at step 19, the SHIFT-IR (Shif) state at steps 20 to 23, the EXIT1-IR (Exit) state at step 24, and the UPDATE-IR (Upd) state at step 25, and returns to the RUN-TEST/IDLE (Idle) state at step 26.

In the SHIFT-IR state at steps 20 to 23, an instruction code B for disabling the Update-DR signal in the output boundary cells BSCO[1] is input to the instruction register from the TDI terminal. Instruction code B may be, for example, a private instruction code. In the UPDATE-IR state in step 25, instruction code B is output from the instruction register to the instruction decoder ID[1].

The value of the Update-En signal supplied to the output boundary cells [1] from the instruction decoder ID[1] thereby becomes '0', preventing the Update-DR signal from passing through the AND gates in the output boundary cells BSCO[1] of the boundary scan register BSR[1]. Accordingly, the latch flip-flops FF2 are not updated, and the data supplied from the DO terminals of the output boundary cells BSCO[1] to the flash memory 102 remain fixed at the above-mentioned control data, such as data for inactivating the flash memory 102. From then on, the flash controller 101 can be tested without unintended write access, or other unnecessary access, to the flash memory 102.

Steps 27–33

The TAP controller transitions to the SELECT-DR-SCAN (Sele) state at step 27, the CAPTURE-DR (Cap) state at step 28, the SHIFT-DR (Shif) state at steps 29–32, and the EXIT1-DR (Exit) state at step 33.

Before step 28, test data are input to the flash controller 101, and the flash controller 101 generates output data resulting from the test.

In the CAPTURE-DR state at step 28, input terminals A of the input multiplexers MUX1 are selected in response to the Shift-DR signal, so that the data input from the DI terminals are captured by the shift flip-flops FF1 in response to the Clock-DR signal. The data output from the flash controller 101 as a result of the test are thereby captured by the shift flip-flops FF1 of the output boundary cells BSCO [1].

In the SHIFT-DR state at steps 29–32, input terminals B of the input multiplexers MUX1 are selected in response to the Shift-DR signal, and the data in the shift flip-flops FF1 are shifted out from the SO terminals in response to the Clock-DR signal. The output data resulting from the test of the flash controller 101 are thereby output from the TDO terminal, completing the first test.

The next test can then be carried out in the same way, by returning through the UPDATE-DR state to the SELECT-DR-SCAN or RUN-TEST/IDLE state and repeating steps 27–33. In the prior art, the transition through the UPDATE-DR state would generate unwanted new output to the flash memory 102, but in the first embodiment the output to the flash memory 102 remains fixed at the above-mentioned control data, such as control data for inactivating the flash memory 102, because the Update-DR signal is disabled.

As described above, according to the first embodiment, the Update-DR signal is supplied to the CK terminals of the latch flip-flops FF2 through the AND gates in the output boundary cells BSCO[1], and can thus be enabled and disabled according to the Update-En signal. The data supplied from the output boundary cells BSCO[1] to the flash memory 102 during a test can thereby be held fixed at desired control data while the testing of the flash controller 101 proceeds. Test time can therefore be reduced, because no unnecessary access, such as an unintended write access, is made to the flash memory 102.

Second Embodiment

Figure 7:
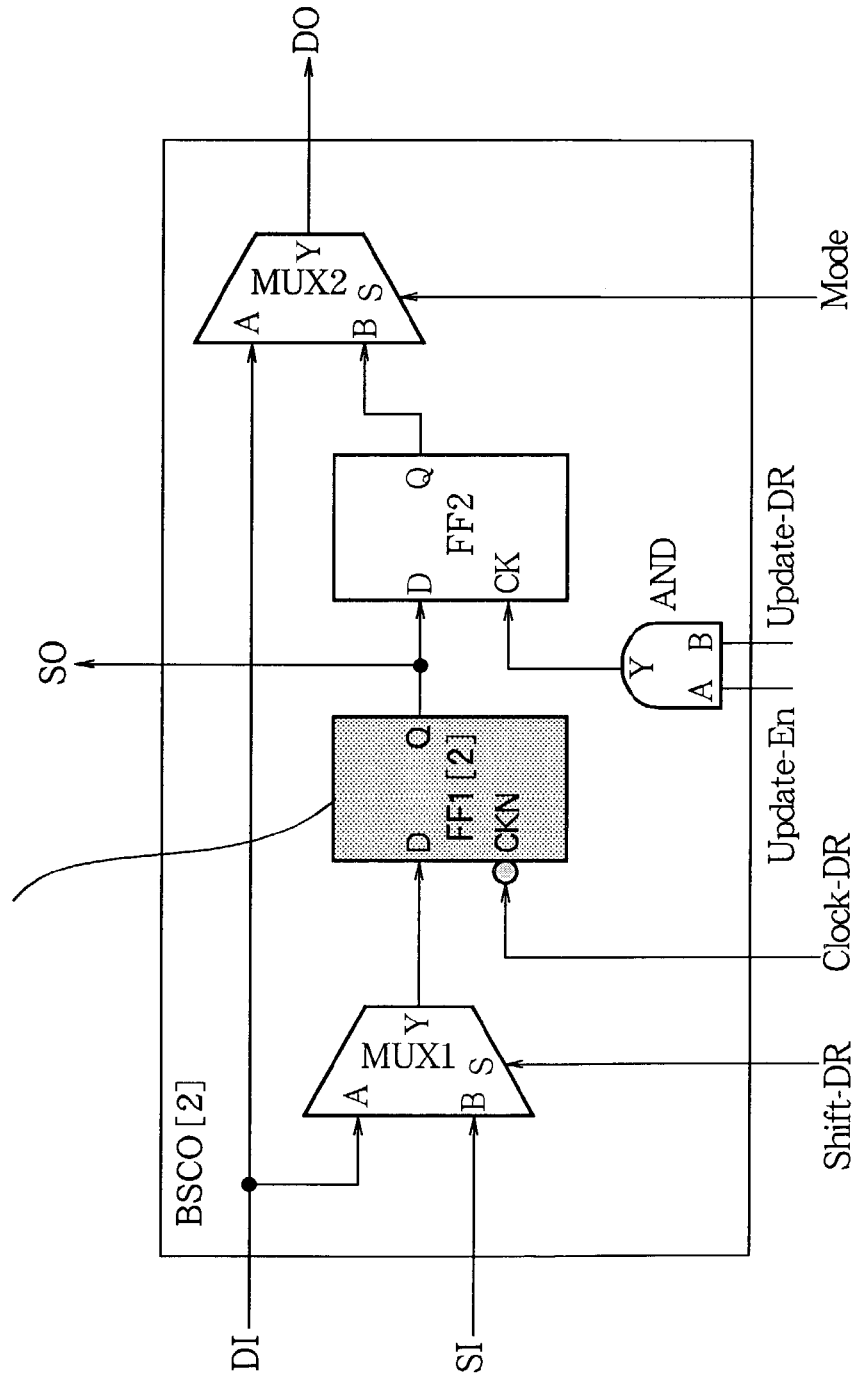
FIG. 7 is a circuit diagram of an output boundary scan cell in a JTAG device illustrating a second embodiment of the invention.

FIG. 7 is a circuit diagram of an output boundary cell BSCO[2] in a JTAG device according to a second embodiment of the present invention.

The JTAG device in the second embodiment is obtained from the JTAG device in the first embodiment by changing the output boundary cell BSCO[1] shown in FIG. 2 to the output boundary scan cell BSCO[2] shown in FIG. 7, this output boundary cell structure being used for each of the output boundary cells shown in FIG. 1. Related changes are also made in the input boundary cells BSCI of the boundary scan register BSR[1] and the TAP controller of the TAP interface TAPIF[1].

The boundary scan circuit thus has the same general structure as in the JTAG device in the first embodiment, but differs in the internal structure of the input and output boundary scan cells and the TAP controller.

The output boundary cell BSCO[2] in FIG. 7 is obtained from the output boundary cell BSCO[1] in the first embodiment, shown in FIG. 2, by changing the shift flip-flop FF1 to a different type of shift flip-flop FF1[2]. The same replacement of shift flip-flop FF1 by shift flip-flop FF1[2] is also made in the input boundary cells BSCI.

The shift flip-flop FF1[2] in the second embodiment is a negative-edge-triggered flip-flop that is driven by the negative (falling) edge of the clock signal Clock-DR, which is input to the clock input (CKN) terminal of the flip-flop FF1[2].

Figure 8:
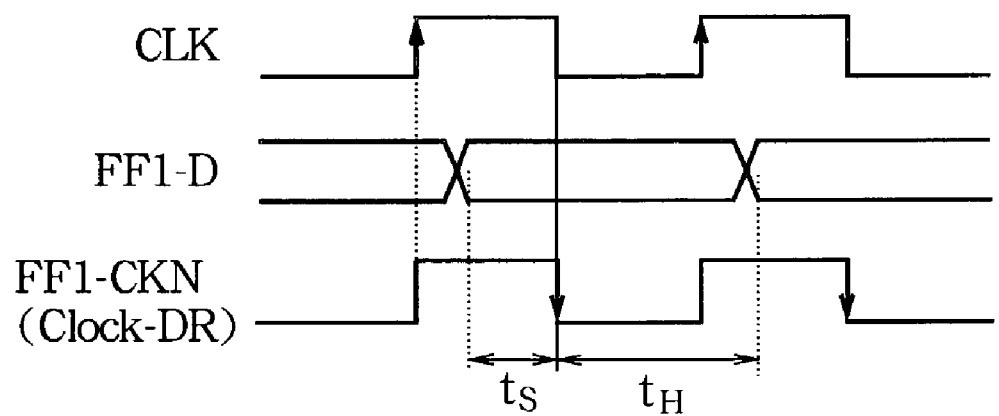
FIG. 8 is a timing diagram illustrating clock signals in the JTAG device in the second embodiment.

FIG. 8 is a timing diagram illustrating the clock signals in the JTAG device in the second embodiment. In the second embodiment, the CLK signal that drives the flash controller 101 and the Clock-DR signal supplied to the CKN terminals of the negative-edge-triggered shift flip-flops FF1[2] in the input and output boundary scan cells are derived from the same clock tree.

The TAP controller TAPC[2] in the second embodiment differs from the TAP controller in the first embodiment in deriving the Clock-DR signal from the same clock tree as the CLK signal.

In the second embodiment, at a positive (rising) edge of the CLK signal, data are output from the flash controller 101 and input to the data input terminals D of the shift-flops FF1[2] of the output boundary cells BSCO[2] through the DI terminals and the input multiplexers MUX1. Next, at the negative (falling) edge of the Clock-DR signal, the data are captured by the shift flip-flops FF1[2] and output from the data output terminals Q of these flip-flops FF1[2] to the SO terminals.

In the second embodiment, as described above, the positive-edge-triggered shift flip-flops FF1 of the first embodiment are changed to negative-edge-triggered shift flip-flops FF1[2] that receive a Clock-DR signal derived from the same clock tree as the CLK signal that drives the flash controller 101. As a result, the set-up time ($t_S$) and hold time ($t_H$) requirements for data input to the data input terminals D of the shift flip-flops are consistently assured, so the JTEG device can be designed without concern for the relative timing of the clock signals of the flash controller 101 and the boundary scan circuit. Clock cycle times can accordingly be reduced, and tests can be carried out at higher speeds than in the first embodiment.

Third Embodiment

Figure 9:
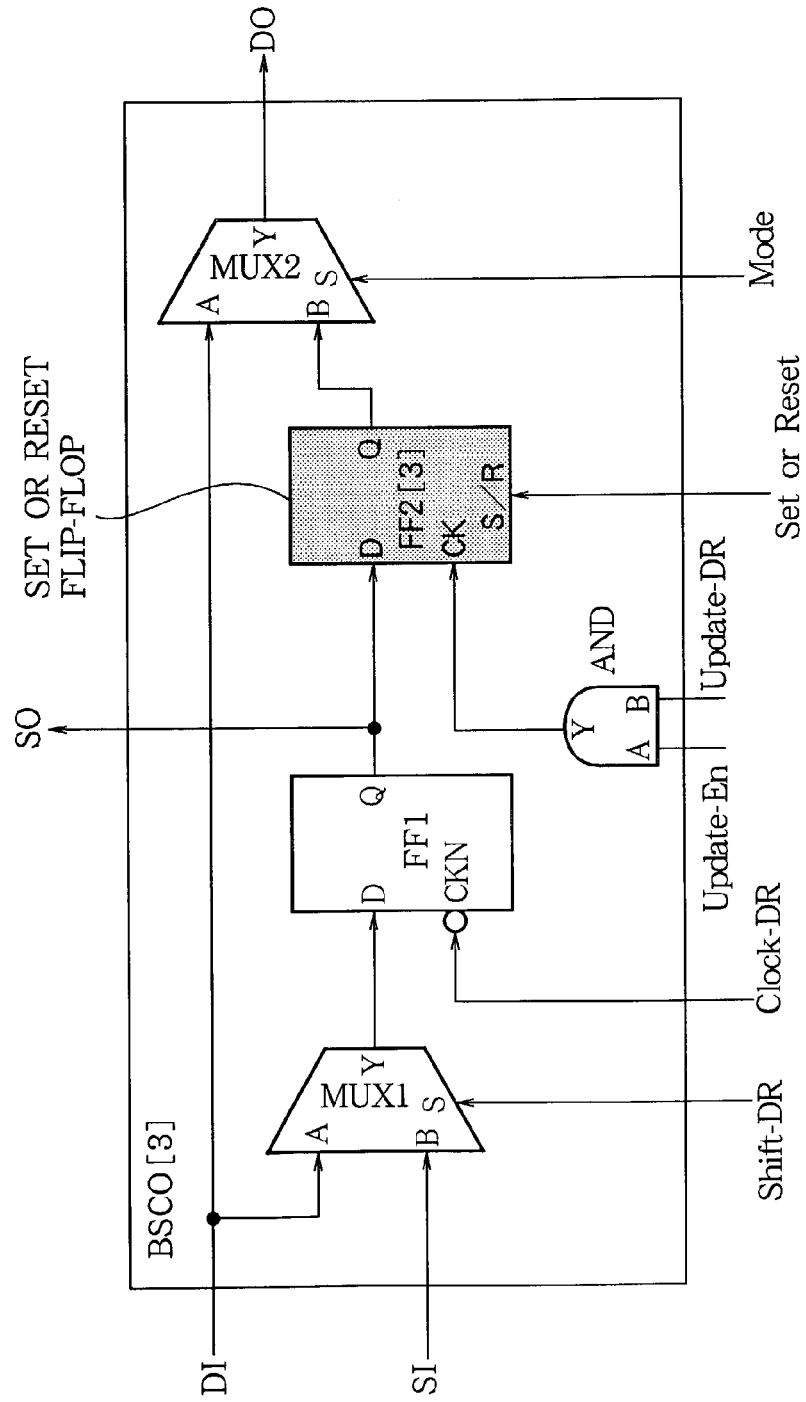
FIG. 9 is a circuit diagram of an output boundary scan cell in a JTAG device illustrating a third embodiment of the invention.

FIG. 9 is a circuit diagram of an output boundary cell BSCO[3] in a JTAG device according to a third embodiment of the present invention.

The JTAG device in the third embodiment is obtained from the JTAG device in the second embodiment by changing the output boundary cell BSCO[2] shown in FIG. 7 to the output boundary scan cell BSCO[3] shown in FIG. 9, this output boundary cell structure being used for each of the output boundary cells shown in FIG. 1. A related change is also made in the instruction decoder ID[1] shown in FIG. 3.

The boundary scan circuit thus has the same general structure as in the JTAG device in the first or second embodiment, but differs in the internal structure of the output boundary scan cells and the instruction decoder.

The output boundary cell BSCO[3] in the third embodiment is obtained from the output boundary cell BSCQ[2] in the second embodiment, shown in FIG. 7, by changing the latch flip-flop FF2 to a different type of latch flip-flop FF2[3].

The latch flip-flop FF2[3] in the third embodiment has a set input terminal or a reset input terminal, the symbol S/R in the drawing denoting either one of these two types of input terminals. A Set signal or a Reset signal is supplied to the S/R terminal of the latch flip-flop FF2[3] from the instruction decoder IR[3].

The instruction decoder ID[3] in the third embodiment differs from the instruction decoder ID[1] in the second embodiment in providing circuitry for generating Set and/or Reset signals according to an instruction code.

In the third embodiment, in the initial part of the test operation, in which control data such as data for inactivating the flash memory 102 are output to the flash memory 102, the Set or Reset signal is input from the instruction decoder ID[3] to the S/R terminal of each latch flip-flop FF2[3]. The control data are thereby set in the latch flip-flops FF2[3]. Input terminals B of the output multiplexers MUX2 are then selected in response to the Mode signal, and instruction code B is set in the instruction register IR, disabling the Update-DR signal. The data output from the DO terminals of the output boundary cells BSCO[3] are thereby held fixed at the control data.

A latch flip-flop FF2[3] for fixing a control data bit to the value of '1', for example, has a set input terminal, while a latch flip-flop FF2[3] for fixing a control data bit to the value of '0' has a reset input terminal.

According to the third embodiment, as described above, the latch flip-flop FF2 in the second embodiment is replaced by a latch flip-flop FF2[3] with a set input terminal or a reset input terminal. During the initial part of a test, a Set signal or a Reset signal is supplied to the set input terminal or reset input terminal of each latch flip-flop FF2[3]. This sets the outputs from the flash controller 101 to the flash memory 102 to the desired control data without the need to send instruction code A and drive the TAP controller through the CAPTURE-DR (Cap) and UPDATE-DR (Upd) states (steps 13 and 15 in FIG. 5). Test cycle times can accordingly be reduced, and tests can be carried out at higher speeds than in the second embodiment.

In the embodiments described above, the data supplied from the latch flip-flops in the output boundary scan cells to the flash memory during a test can be held fixed at desired control data while the testing of the IP core (the flash controller) proceeds. The test time of the IP core can therefore be reduced.

A few variations of the preceding embodiments have been mentioned above, but those skilled in the art will recognize that further variations are possible within the scope of the invention, which is defined by the appended claims.

What is claimed is:

1. A boundary scan circuit integrated into a Joint Test Action Group (JTAG) device for testing a first circuit in the JTAG device, the first circuit having an input node and an output node, the JTAG device also including a second circuit having an input node coupled to the output node of the first circuit, the boundary scan circuit comprising:
   a boundary scan register having a first cell connected to the input node of the first circuit, and a second cell connected between the output node of the first circuit and the input node of the second circuit, the second cell having a latch flip-flop supplying latched data to the second circuit; and
   a Test Access Port (TAP) interface controlling the boundary scan register, the TAP interface enabling and disabling a latching operation by the latch flip-flop in the second cell according to an input instruction code.

2. The boundary scan circuit of claim 1, wherein the input instruction code is a private instruction code.

3. The boundary scan circuit of claim 1, wherein:
the TAP interface supplies the second cell with a latch clock signal;
the TAP interface also supplies the second cell with a latch enable signal for enabling and disabling the latch clock signal;
the latch flip-flop has a clock input terminal; and
the second cell has a logic circuit for performing a logic operation on the latch clock signal and the latch enable signal and supplying a resulting signal to the clock input terminal of the latch flip-flop.

4. The boundary scan circuit of claim 3, wherein the logic circuit is an AND gate.

5. The boundary scan circuit of claim 1, wherein:
the first cell has a shift flip-flop;
the TAP interface supplies the shift flip-flop with a shift clock signal;
the first circuit operates on a system clock signal; and
the system clock signal and the shift clock signal are derived from a single clock tree in the JTAG device.

6. The boundary scan circuit of claim 5, wherein the shift flip-flop is a negative-edge-triggered flip-flop.

7. The boundary scan circuit of claim 1, wherein:
the latch flip-flop in the second cell has a set or reset input terminal for setting the latch flip-flop to a predetermined state; and
the TAP interface activates the set or reset input terminal of the latch flip-flop at the beginning of a test of the first circuit.

8. The boundary scan circuit of claim 1, wherein the first circuit is an intellectual-property core.

9. The boundary scan circuit of claim 1, wherein the first circuit is a flash controller and the second circuit is a flash memory.

10. A method of testing a first circuit in a JTAG device, the first circuit having an input node and an output node, the JTAG device also including a second circuit and a boundary scan register, the second circuit having an input node coupled to the output node of the first circuit, the boundary scan register having a first cell connected to the input node of the first circuit and a second cell connected between the output node of the first circuit and the input node of the second circuit, the second boundary scan cell having a latch flip-flop supplying latched data to the second circuit, the method comprising;
setting control data in the latch flip-flop for output to the second circuit;
disabling further latching operations by the latch flip-flop;
supplying test input data to the first circuit through the first cell in the boundary scan register;
obtaining test output data from the first input circuit through the second cell in the boundary scan register; and
repeating the steps of supplying test input data and obtaining test output data, the latching operation by the latch flip-flop remaining disabled.

11. The method of claim 10, wherein the JTAG device also includes a TAP controller, and disabling further latching operation comprises supplying a private instruction code to the TAP controller.

12. The method of claim 10, wherein the JTAG device also includes a TAP controller, the method further comprising:
supplying an update signal from the TAP controller to the second cell;
supplying an update-enable signal from the TAP controller to the second cell;
performing a logic operation on the update signal and the update-enable signal in the second cell, thereby generating a gated update signal; and
supplying the gated update signal to a clock input terminal of the latch flip-flop.

13. The method of claim 12, wherein the logic operation is an AND operation.

14. The method of claim 10, wherein the first cell has a shift flip-flop, the method further comprising:
supplying a system clock signal to the first circuit; and
supplying a shift clock signal from the TAP controller to the shift flip-flop, the system clock signal and the shift clock signal being derived from a single clock tree in the JTAG device.

15. The method of claim 14, wherein the shift flip-flop is a negative-edge-triggered flip-flop.

16. The method of claim 10, wherein the second cell has a shift flip-flop, and setting control data in the latch flip-flop comprises capturing the control data in the shift flip-flop of the second cell.

17. The method of claim 10, wherein the second cell has a shift flip-flop, and setting control data in the latch flip-flop comprises shifting the control data into the shift flip-flop of the second cell through the boundary scan register.

18. The method of claim 10, wherein the latch flip-flop in the second cell has a set or reset input terminal, and setting control data in the latch flip-flop comprises activating the set or reset input terminal.

19. The method of claim 10, wherein the first circuit is an intellectual-property core.

20. The boundary scan circuit of claim 10, wherein the first circuit is a flash controller and the second circuit is a flash memory.

* * * * *